INTEGRATED SEMICONDUCTOR TUNNEL DIODE AND RESISTANCE

Filed March 13, 1962

INVENTOR.
NAPOLEONE FORMIGONI

BY C. L. Menzemer

ATTORNEY

United States Patent Office 3,211,923

Patented Oct. 12, 1965

3,211,923

INTEGRATED SEMICONDUCTOR TUNNEL DIODE AND RESISTANCE

Napoleone Formigoni, Wilkinsburg, Pa., assignor to Westinghouse Electric Corporation, East Pittsburgh, Pa., a corporation of Pennsylvania Filed Mar. 13, 1962, Ser. No. 179,445

4 Claims. (Cl. 307—88.5)

This invention relates to a semiconductor device and more particularly to a monolithic semiconductor device that functions as a bistable multivibrator and is contained in a unitary body of a semiconductor material.

In many computing, data processing, switching systems and the like, bistable multivibrators are needed in large numbers. Such devices have been provided heretofore by appropriately interconnected vacuum tubes and associated circuitry and more recently by using transistors in the prior circuits in place of the vacuum tubes. The substitution of transistors for vacuum tubes improved those multivibrators because transistors are smaller and more rugged than vacuum tubes, require no filament power, operate at a low voltage supply, dissipate relatively little power and ordinarily have a service life that exceeds that of heated vacuum tubes.

Bistable multivibrators are used in large numbers, and accordingly the advantages attending transistor substitution are multiplied. However, even transistor containing devices are complex and bulky in the aggregate and are subject to material failure because of the many parts and connections that need be made.

It is therefore a major object of the present invention to provide a bistable multivibrator comprising, in a unitary block of semiconductor material, a tunnel diode and a series resistance electrically joined thereto without any external leads between the several portions.

Other objects of the invention will be apparent from the following detailed description.

The invention will be described in conjunction with the attached drawings, in which.

High speed bistable multivibrators have been provided heretofore in a circuit including transistors, capacitors and resistors. The same function can be provided with the circuit shown in FIG. 1 in which a tunnel diode 12 is provided in series with a load resistor 10. Upon proper biasing and with the load resistor having an absolute value greater than the tunnel diode negative resistance, the circuit is bistable and can be operated as a high speed flip-flop or multivibrator.

Figure 1:
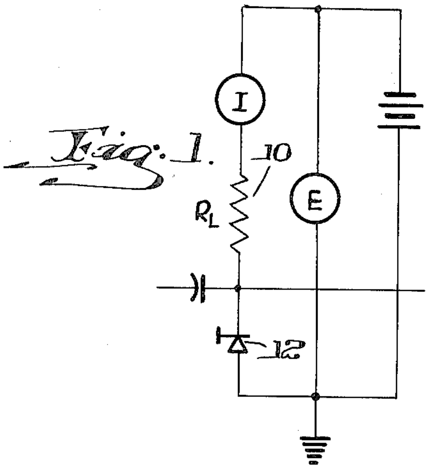
FIG. 1 shows a bistable multivibrator circuit including a tunnel diode.
Figure 2:
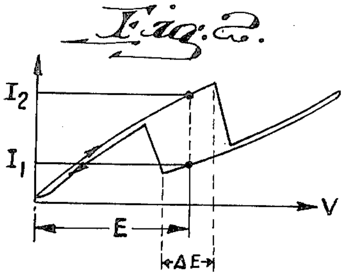
FIG. 2 is a typical oscilloscope trace of the voltage-current characteristic of a multivibrator as shown in FIG. 1.

The voltage-current characteristic of the circuit shown in FIG. 1 with the oscilloscopic traces somewhat spaced apart for clarity is shown in FIG. 2. The voltage E is one of the possible bias voltages to be applied to the circuit trigger point. The increment $\Delta E$ indicates the voltage range over which bistable operation is effective. For any given bias voltage in this range there are two possible current values, namely $I_1$ and $I_2$. If the current is set at either of these two levels, a slight trigger to either raise or lower the existing voltage will cause the prevailing current to switch instantly to the other value. Once it is at its other value, triggering with another voltage will cause it to switch back as desired. In accordance with the present invention this entire function is provided in a unitary body of semiconductor material.

For the purpose of clarity, the present invention will be described specifically in terms of preparing a bistable multivibrator in a semiconductive germanium dendrite. It will be understood, however, that in addition to germanium other semiconductor materials may be used, for example, silicon, silicon carbide or a semiconducting compound comprised, for example, of stoichiometric proportions of elements from Group III of the Periodic Table, for example, gallium, aluminum and indium, and elements from Group V, for example arsenic, phosphorus and antimony. Examples of suitable III–V stoichiometric compounds include gallium arsenide and indium antimonide. It will also be understood that the germanium or other semiconductor may be processed so that the semiconductivity of the various regions may be reversed in preparing the devices.

Figure 3:
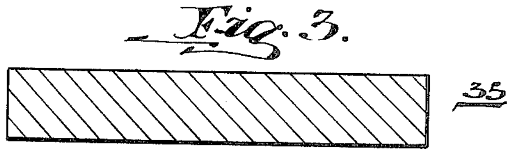
FIG. 3 is a side view in section of a semiconductive dendrite for use in this invention.

Referring to FIGURE 3, there is shown a side view, in section, of a germanium dendrite 35 of n-type semiconductivity. The dendrite 35 can be prepared, for example, in accordance with the disclosure in United States patent application Serial Number 844,288, filed October 5, 1959, now patent 3,031,403, issued April 24, 1962 to A. I. Bennett, Jr., having the same assignee as that of the present application. Alternatively, the semiconductor body for use in this invention can be prepared from a single crystal silicon rod obtained, for example, as by pulling from a melt comprised of silicon and at least one element from Group V of the Periodic Table such as arsenic, antimony, or phosphorus. A suitable slice of silicon is then cut from the rod with, for example, a diamond saw. In either case, namely conventional single crystal or dendrite 35, the amounts of impurity in the starting material are not critical because a suitable impurity is to be introduced at a very high concentration in the semiconductor crystal in order to make it usable for tunnel diode fabrication. Consequently, dendrite 35 can have a resistivity in the range of 5 to 100 ohm cm.; preferably material of 20 to 50 ohm cm. resistivity should be used.

In order to increase the impurity concentration in the crystal, arsenic, which is known to have highest solid solubility in germanium, is diffused into the dendrite so as to obtain a heavily doped skin better than 75 microns deep. The diffusion is performer in unsaturated arsenic vapour at a temperature of about 800° to 850° C. for several hours, in order to obtain a diffused layer of the desired thickness having an arsenic concentration of better than $5 \times 10^{19}$ cm.$^3$.

Figure 4:
FIGS. 4 and 5 are side views in section of the semiconductive dendrite of FIG. 1 being further processed in accordance with the present invention.

After diffusion, and as indicated in FIG. 4, the dendrite comprises a degenerate skin 36 and a main body 37 of the n-type germanium dendrite 35. The depth or thickness of the highly conductive skin area should be on the order of about 1 to 2 mils with a 7 mil thick dendrite base structure. This thickness generally is determined by the desired design characteristics of the completed bistable multivibrator, but it must be deep enough to permit the alloying or fusion of a tunnel contact without penetration through to the semiconductive central zone 37.

Figure 5:

A sphere 39 of an alloy of 0.5 percent gallium and the remainder indium is then alloyed to one end of the dendrite 35 (FIG. 5). This is accomplished by placing a sphere in contact with the germanium dendrite and heating them at a temperature of about 600° C. to alloy or fuse the sphere to the dendrite. Of course, other p-type materials such as boron, aluminum or mixtures thereof with one another or with gallium and indium, can be used. It is also within the invention to include in the sphere that is to make a suitable tunnel junction with the dendrite substrate a neutral metal. The neutral metal is chosen with the view to obtaining good contact and reasonable alloying or fusion temperatures and its choice is a metallurgical problem well within the skill of the artisan.

The alloying or fusion of the sphere 39 to the dendrite results in a p-n junction 42 at the interface of the alloyed sphere 39 to the semiconductive degenerate region 36 of the dendrite 35 as is indicated in FIG. 5.

The thus prepared body of semiconductor material is then assembled to a metallized ceramic support 44 by soldering the dendrite 35 at its ends to the ceramic base. Any of the conventional soft solders can be used for this purpose, provided good ohmic contacts are obtained. The soldered connections 46 and 48 resulting constitute ohmic contacts to the device.

Figure 6:
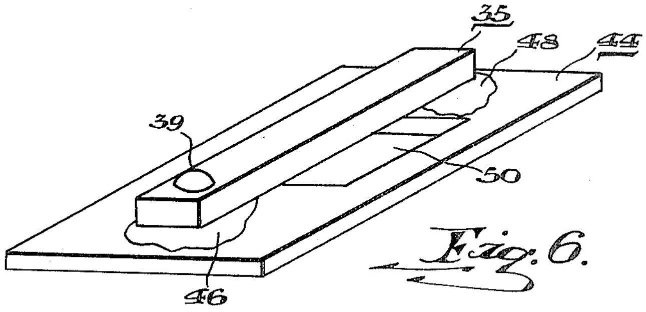
FIGS. 6, 7 and 8 are perspective schematic views of the semiconductive body being further processed to a bistable multivibrator in accordance with the invention.
Figure 7:
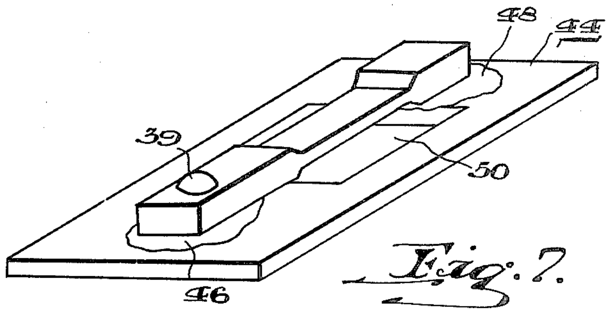
Figure 8:
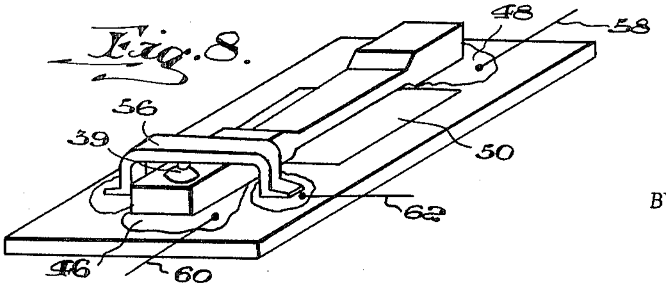

As shown in FIGS. 6, 7 and 8, the ceramic support 44 has a central window 50 under the intermediate portion of the dendrite. Window 50 serves primarily to provide access to the lower side of the dendrite. The end portions of the dendrite are masked, as by being coated with an etch resistance wax, such as Apiezon wax. Then the exposed or unmasked portions of the dendrite are etched gradually with an etching solution, for example, anodically dissolved in an aqueous 10 percent sodium hydroxide solution. The etching removes the heavily doped skin of the crystal leaving the central high resistivity portion. Sufficient of the skin is removed so that the remaining body shows a resistance that is higher than the absolute value of the negative resistance of the tunnel diode as indicated hereinbefore. Upon completion of the etching, the wax is removed.

Leads are then attached to the body as shown in FIG. 8. For this purpose, it is convenient to provide a metal contact to the tunnel contact 39. This is accomplished by soldering a bridge member 56 to the ceramic base with the underside of the top of the bridge in contact with the tunnel spherical contact 39. Then appropriate electrical leads are soldered to the unit. For example, a negative bias lead 58 is attached to the solder ohmic contact 48. An input-output lead 60 is attached to the ohmic contact 46 on the dendrite under the tunnel contact. A power lead 62 is applied to the tunnel contact by attaching it to the bridge 56, preferably where the bridge is soldered to the ceramic base 44. The device as thus described is a molecularized bistable multivibrator.

The invention will be described further in conjunction with the following example in which the details are given by way of illustration and not by way of limitation.

*Example*

An n-type germanium dendrite oriented along the (111) plane and having dimensions of about 250 x 50 x 10 mils is placed in an evacuated furnace. The skin of the dendrite is made degenerate by diffusing arsenic into it to a skin concentration of approximately $10^{20}$ donors/cm.$^3$ by maintaining the dendrite at about 850° C. while maintaining an atmosphere of arsenic in the furnace. The dendrite is removed from the furnace and then a sphere of an alloy containing 0.5 percent gallium and the remainder indium is alloyed to one end of the dendrite to a depth of about 1 to 2 mils by heating the sphere in contact with the dendrite at a temperature of about 600° C. The dendrite is then attached to a generally rectangular ceramic base having a central cutaway portion, by ohmic contacts composed of soft solder by heating to 200° C. The diode is masked at each end with a coating of Apiezon wax. Then the central region is anodically etched with an aqueous 10 percent sodium hydroxide solution until the skin is removed to a depth of about 1½ mils. The wax is removed and then leads are soldered to the device as shown in FIG. 8.

In the foregoing simple manner, a highly effective bistable multivibrator or flip-flop is provided. Because the negative resistance in the tunnel diode region is not due to minority carriers as in other transistor-like switches, the speed of the tunnel diode multivibrator is very high and is limited by the impedance of the mounting structure rather than by the tunnel diode switching speed. Moreover the tunnel diode electric characteristic is practically unaffected by surface phenomena and is relatively insensitive to temperature changes. These characteristics contribute to the multivibrator stability and reliability.

Monolithic bistable multivibrators prepared as described in the above example have been tested and have shown satisfactory performance as high as 10 mc. Typical characteristics of test units are as follows: operating voltage, 0.4 v.; I max., 40 ma.; I min., 10 ma.; load resistance, 6.5 ohms; triggering rate, D.-C. to 10 mc.; output voltage, 0.2 v.; operating temperature, 0–50° C. The device can be used in extremely high speed computers, data processing and switching systems with greatly increased reliability and decreased power consumption.

While the invention has been described with respect to particular materials and a particular manner of production, it will be apparent to the artisan that the details can be varied. For example, the differently doped regions in the monolithic block of semiconductive material can be achieved by selective diffusion. Thus, the germanium block surface can be masked by evaporting silicon oxide thereon. Thereafter, arsenic or the like can be diffused into the block through the unmasked portions to result in a block with two regions of greatly different resistivity. The highly doped or low resistivity region is used for the tunnel diode and the other is used as the load resistance. This procedure offers the advantage of keeping a uniform cross section to provide greater mechanical strength. It also eliminates the time consuming etching process. Other variations will be apparent upon consideration of the foregoing detailed description.

While the invention has been described with reference to detailed embodiment, it should be understood that the invention can be practiced otherwise without departing from its scope.

I claim:

1. A monolithic semiconductor device comprising: a unitary body of semiconductive material including a first region of a first semiconductivity type having a major portion of high resistivity and a second region of a second semiconductivity type joined with said first region to form a p-n junction; the portion of said first and second regions at said junction being entirely of degenerate material so that all portions of said p-n junction exhibit tunnel diode characteristics; a first ohmic contact on said second region and a second ohmic contact on said first region forming the electrodes of a tunnel diode; and a third ohmic contact on said first region spaced from said second contact to provide a predetermined resistance magnitude therebetween in series with said p-n junction.

2. A monolithic semiconductor device comprising: a unitary body of semiconductive material including a first region having a predominant doping of donor impurity atoms, a second region having a predominant doping of acceptor impurity atoms in a concentration sufficient to make said region degenerate, said first and second regions disposed immediately adjacent each other, said first region having a first portion doped in a concentration sufficient to make said region degenerate at the boundary between it and said second region to form only a junction exhibiting tunnel diode characteristics; said first region having a second portion of higher resistivity than said first portion; a first ohmic contact on said second region and a second ohmic contact on said first region providing tunnel diode electrodes; a third ohmic contact on said first region spaced from said second contact to provide a predetermined resistance magnitude therebetween in series with said junction greater than the absolute value of negative resistance of said junction.

3. A monolithic semiconductor device in accordance with claim 2 wherein said first region is a portion of a germanium dendrite and said second region is fused to a portion of the surface of said germanium dendrite.

4. A bistable multivibrator comprising a unitary body of semiconductive material including a first region of first semiconductivity type having a major portion of high resistivity and a second region of second semiconductivity type joined with said first region to form a p-n junction; the portion of said first and second regions at said junction being entirely of degenerate material so that all portions of said p-n junction exhibit tunnel diode characteristics; a first ohmic contact on said second region and a second ohmic contact on said first region forming a pair of tunnel diode electrodes; a third ohmic contact on said first region spaced from said second contact to provide a predetermined resistance magnitude therebetween in series with said p-n junction; means to apply a bias voltage across the series combination of said p-n junction and said resistance to bias said device at the portion of its characteristic curve wherein two possible current values exist for each voltage; means to apply a trigger signal to one of said contacts to effect a shift in current from a first to a second of said two current values; said resistance value being in excess of the absolute value of negative resistance of the tunnel diode.

References Cited by the Examiner

UNITED STATES PATENTS 3,079,512 2/63 Rutz ---------------- 317—234

FOREIGN PATENTS 1,113,035 8/61 Germany.

DAVID J. GALVIN, *Primary Examiner.*